(12) United States Patent
Brezina et al.

(10) Patent No.: US 6,614,658 B2
(45) Date of Patent: Sep. 2, 2003

(54) FLEXIBLE CABLE STIFFENER FOR AN OPTICAL TRANSCEIVER

(75) Inventors: Johnny R. Brezina, Austin, TX (US); Brian M. Kerrigan, Austin, TX (US); Gerald D. Malagrino, Jr., Rochester, MN (US); James R. Moon, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/007,028

(22) Filed: Nov. 5, 2001

(65) Prior Publication Data

US 2003/0086244 A1 May 8, 2003

(51) Int. Cl.⁷ ................................................. H05K 7/20
(52) U.S. Cl. ...................... 361/707; 174/16.3; 165/80.3; 165/185; 257/707; 385/88; 385/91; 361/710; 361/715; 361/749; 361/760
(58) Field of Search ......................... 174/16.3; 165/80.2, 165/80.3, 185; 257/706–707, 712–713, 718–719, 726–727; 385/88–92; 361/704–710, 715, 749, 717–721, 760

(56) References Cited

U.S. PATENT DOCUMENTS

| | | | | |
|---|---|---|---|---|
| 5,673,479 A | * | 10/1997 | Hawthone | 361/760 |
| 5,969,945 A | * | 10/1999 | Cutting et al. | 361/704 |
| 5,998,241 A | * | 12/1999 | Niwa | 257/712 |
| 6,008,991 A | * | 12/1999 | Hawthorne et al. | 361/707 |

OTHER PUBLICATIONS

U.S. patent application Ser. No. 09/956,771, Brezina et al., filed Sep. 20, 2001.
U.S. patent application Ser. No. 10/007,027, Brezina et al., filed Nov. 5, 2001.
U.S. patent application Ser. No. 10/006,644, Brezina et al., filed Nov. 5, 2001.
U.S. patent application Ser. No. 10/007,026, Brezina et al., filed Nov. 5, 2001.
U.S. patent application Ser. No. 10/006,836, Brezina et al., filed Nov. 5, 2001.
U.S. patent application Ser. No. 10/007,024, Brezina et al., filed Oct. 25, 2001.
U.S. patent application Ser. No. 10/006,834, Brezina et al., filed Nov. 5, 2001.

(List continued on next page.)

Primary Examiner—Gregory Thompson
(74) Attorney, Agent, or Firm—Cardinal Law Group; Casimer K. Salys

(57) ABSTRACT

An optical transceiver utilizes a stiffener including a surface adapted for attachment of a portion of a flexible circuit having electrical components that protrude from the flexible circuit. The surface of the stiffener includes one or more cavities configured for receiving the electrical components that protrude from the flexible circuit. The stiffener may also include solder posts for mounting the stiffener on a rigid circuit board of an electronic device incorporating the transceiver, with the solder posts having a shoulder for spacing the stiffener at a predetermined distance from the circuit board of the electronic device. The stiffener may also include provisions for attaching a heat sink. The optical transceiver may include the flexible circuit, heat sink, and rigid circuit board.

20 Claims, 2 Drawing Sheets

OTHER PUBLICATIONS

U.S. patent application Ser. No. 10/007,023, Brezina et al., filed Nov. 5, 2001.
U.S. patent application Ser. No. 10/006,837, Brezina et al., filed Nov. 5, 2001.
U.S. patent application Ser. No. 10/006,835, Brezina et al., filed Nov. 5, 2001.
U.S. patent application Ser. No. 10/006,838, Brezina et al., filed Dec. 5, 2001.
U.S. patent application Ser. No. 10/006,839, Brezina et al., filed Nov. 5, 2001.
U.S. patent application Ser. No. 10/007,215, Brezina et al., filed Nov. 5, 2001.

* cited by examiner

FLEXIBLE CABLE STIFFENER FOR AN OPTICAL TRANSCEIVER

RELATED APPLICATIONS

This application claims priority to U.S. patent application Ser. No. 09/956,771 filed on Sep. 20, 2001 entitled "Fiber Optic Transceiver, Connector, And Method of Dissipating Heat" by Johnny R. Brezina, et al., the entire disclosure of which is incorporated by reference, herein.

This application also relates to the following applications, filed concurrently herewith:

"Optical Alignment In A Fiber Optic Transceiver", by Johnny R. Brezina, et al. U.S. patent application Ser. No. 10/007,027 filed on Nov. 5, 2001;

"External EMI Shield For Multiple Array Optoelectronic Devices", by Johnny R. Brezina, et al., U.S. patent application Ser. No. 10/006,644 filed on Nov. 5, 2001;

"Packaging Architecture For A Multiple Array Transceiver Using A Continuous Flexible Circuit", by Johnny R. Brezina, et al. U.S. patent application Ser. No. 10/007,026 filed on Nov. 5, 2001;

"Enhanced Folded Flexible Cable Packaging for Use in Optical Transceivers, by Johnny R. Brezina, et al. U.S. patent application Ser. No. 10/006,836 filed on Nov. 5, 2001;

"Apparatus and Method for Controlling an Optical Transceiver", by Johnny R. Brezina, et al. U.S. patent application Ser. No. 10/007,024 filed on Oct. 25, 2001;

"Internal EMI Shield for Multiple Array Optoelectronic Devices", by Johnny R. Brezina, et al. U.S. patent application Ser. No. 10/006,834 filed on Nov. 5, 2001;

"Multiple Array Optoelectronic Connector with Integrated Latch", by Johnny R. Brezina, et al. U.S. patent application Ser. No. 10/007,023 filed on Nov. 5, 2001;

"Mounting a Lens Array in a Fiber Optic Transceiver", by Johnny R. Brezina, et al. U.S. patent application Ser. No. 10/006,837 filed on Nov. 5, 2001;

"Packaging Architecture for a Multiple Array Transceiver Using a Flexible Cable", by Johnny R. Brezina, et al. U.S. patent application Ser. No. 10/006,835 filed on Nov. 5, 2001;

"Packaging Architecture for a Multiple Array Transceiver Using a Flexible Cable and Stiffener for Customer Attachment", by Johnny R. Brezina, et al. U.S. patent application Ser. No. 10/006,838 filed on Dec. 5, 2001;

"Packaging Architecture for a Multiple Array Transceiver Using a Winged Flexible Cable for Optimal Wiring", by Johnny R. Brezina, et al. U.S. patent application Ser. No. 10/006,839 filed on Nov. 5, 2001; and "Horizontal Carrier Assembly for Multiple Array Optoelectronic Devices", by Johnny R. Brezina, et al. U.S. patent application Ser. No. 10/007,215 filed on Nov. 5, 2001.

TECHNICAL FIELD OF THE INVENTION

This invention relates to flexible cables or flexible printed circuit boards in optical transceivers.

BACKGROUND OF THE INVENTION

Devices known as optical transceivers are often used to transmit and receive signals in electronic equipment, such as computers and telephone systems. These optical transceivers typically have a laser for generating an output signal that is transmitted through a fiber optic cable, and a detector for receiving a signal from a fiber optic cable. The laser and detector of the optical transceiver, and other electrical components required to operate the optical transceiver must be connected together into an electronic circuit.

The optical transceiver must also include electrical circuit components and mechanical components for mounting and connecting the optical transceiver into the computer or other electronic equipment using the optical transceiver for signal communication. The optical transceivers need to be small in size to fit into the electronic equipment, and yet provide convenient mounting and connection devices to facilitate connection with circuit boards in the electronic equipment by conventional production soldering methods.

The optical transceiver and its associated electronic components generate heat during operation. This heat must sometimes be removed by a heat sink in order to obtain acceptable operating life of the optical transceiver.

Providing the functionality described above, within the tight constraints on the size of the optical transceiver, presents a considerable challenge to designers.

What is needed, therefore, is an improved optical transceiver and method for connecting the transceiver to a circuit board.

SUMMARY OF THE INVENTION

Our invention provides an improved optical transceiver having a stiffener including a surface adapted for attachment of a portion of a flexible circuit having electrical components that protrude from the flexible circuit. The surface of the stiffener includes one or more cavities configured for receiving the electrical components that protrude from the flexible circuit.

In one form, the stiffener further includes solder posts for mounting the stiffener on a rigid circuit board of an electronic device incorporating the transceiver. The solder posts may include a shoulder for spacing the stiffener at a predetermined distance from the circuit board of the electronic device.

The portion of the flexible circuit attached to the stiffener may have a first faying surface thereof adapted for attachment to the surface of the stiffener, and a second faying surface thereof bearing solder balls for attachment of the flexible circuit of the transceiver to the rigid circuit board to create an electrical input/output (I/O) interface. The electrical components may be mounted in the cavities in the stiffener and extend through holes in the flexible circuit aligned with the cavities. The electrical components may be electrically attached to the second faying surface with wire bonds. The electrical components may be mounted within the cavities using an electrically and thermally conductive adhesive to thereby provide both an electrical ground and thermal connection between the electrical component and the stiffener.

The stiffener may also include a second surface adapted for attachment to a heat sink. The second surface of the stiffener may include standoffs to space the second surface of the stiffener at a predetermined distance from the heat sink, thereby creating a gap of known width to be filled with a thermally conductive pad or material.

The flexible circuit may include a second portion thereof bearing other electrical components, and having a heat sink surface which can be moved into contact with the heat sink by bending the flexible circuit. The heat sink may be L-shaped with the stiffener being adapted for attachment to the outer surface of one of the legs of the L-shaped heat sink, and the heat sink surface of the flexible circuit being adapted to be attached to the outer surface of the second leg of the L-shaped heat sink.

Our invention also provides a method for constructing an optical transceiver apparatus as described above.

The foregoing and other features and advantages of the invention are apparent from the following detailed description of exemplary embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE DRAWINGS

Figure 1:
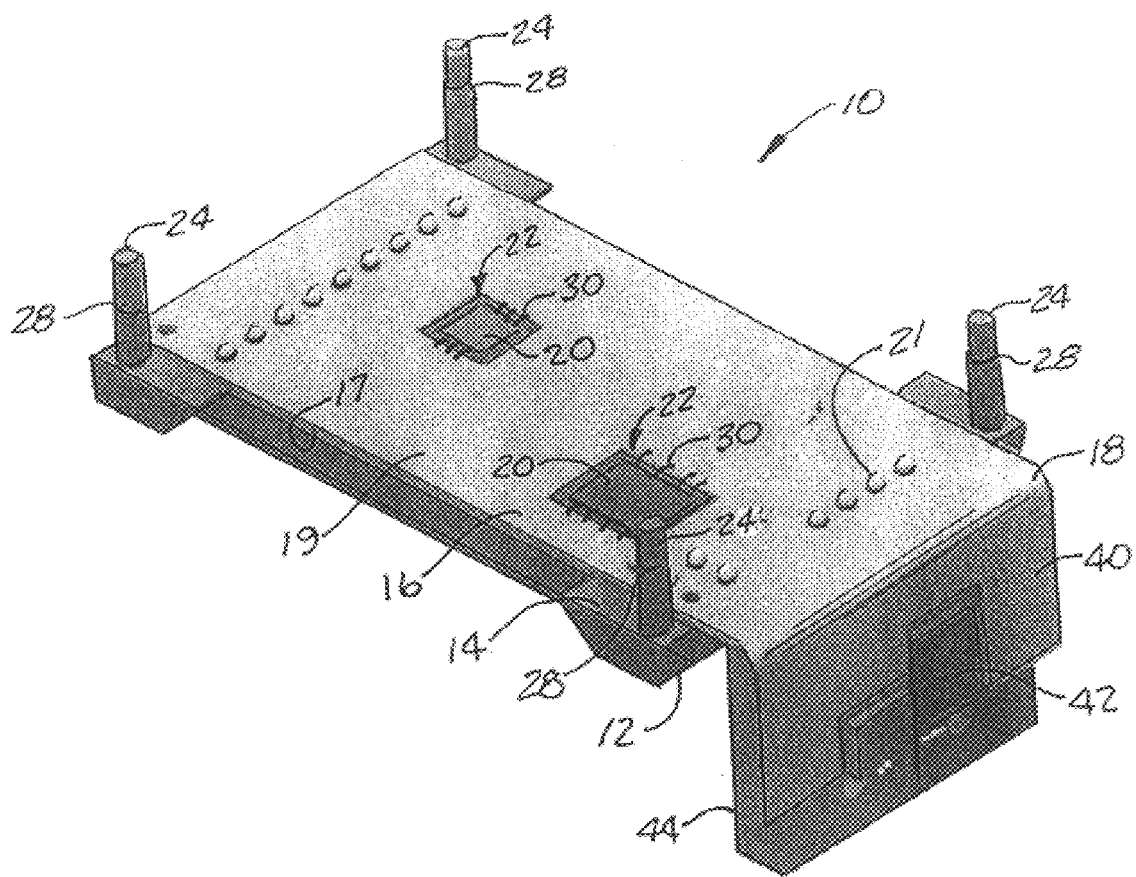
FIG. 1 is an isometric bottom view of an optical transceiver having a stiffener, in accordance with our invention.
Figure 2:
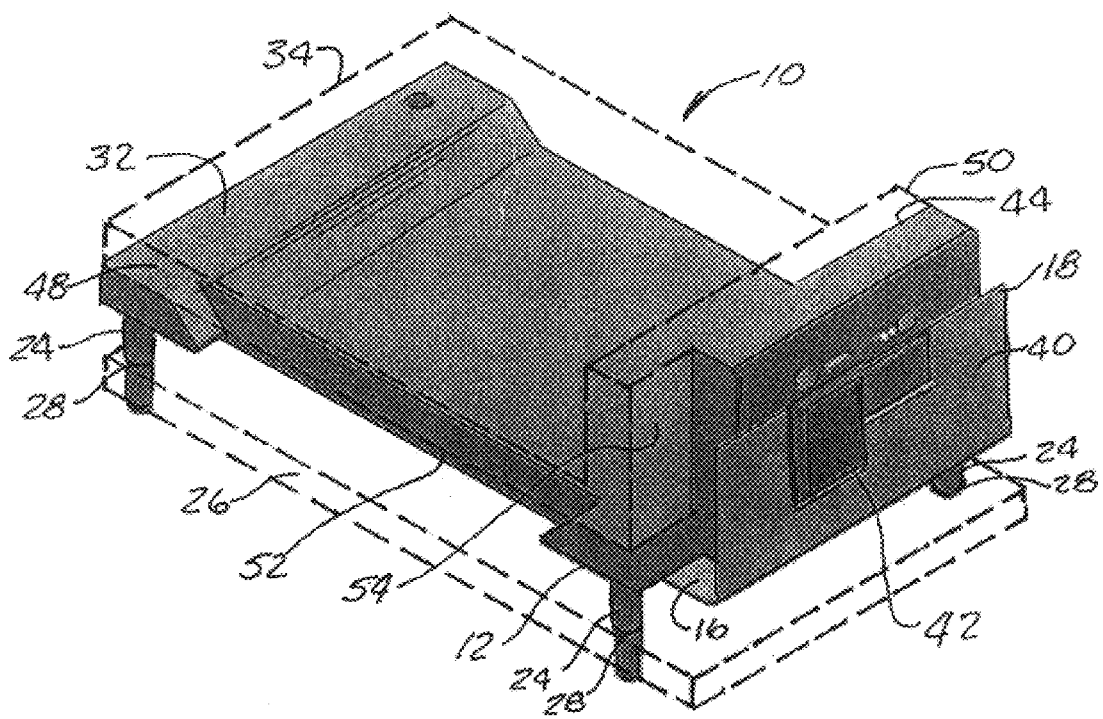
FIG. 2 is an isometric top view of the transceiver of FIG. 1.
Figure 3:
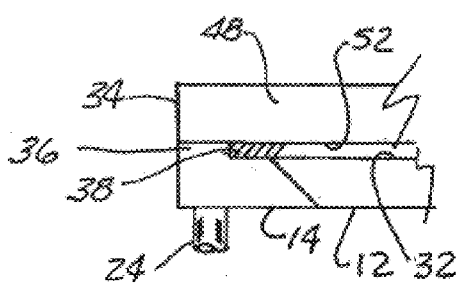
FIG. 3 is an orthographic elevation view illustrating a stiffener attached in a spaced manner to a heat sink, in accordance with our invention.

FIGS. 1–3 depict an exemplary embodiment of an optical transceiver apparatus 10. The optical transceiver apparatus 10 includes a stiffener 12, having a first surface 14 adapted for attachment of a first portion 16 of a flexible circuit 18 having an electrical component 20 protruding therefrom. The first surface 14 of the stiffener 12 has a cavity 22 configured for receiving the electrical component 20. The flexible circuit 18 may have more than one electrical component 20 protruding from the first portion 16 of the flexible circuit 18, and the stiffener 12 may have a cavity 22 for each component 20, or more than one component 20 may share a common cavity 22.

The first portion 16 of the flexible circuit 18 may have a first faying surface 17 for attachment to the first face 14 of the stiffener 12, and a second faying surface 19 bearing solder balls 21 for making electrical connection to a rigid circuit board 26, by standard production methods such as wave or induction soldering.

The stiffener 12 includes solder posts 24 extending outward from the first surface 14 and adapted for mounting the stiffener 12 on the circuit board 26, as indicated by dashed lines in FIG. 2. The solder posts 26 include a shoulder 28 for spacing the first face 14 of the stiffener a predetermined distance away from the circuit board 26.

The electrical component 20 is connected to the flexible circuit 18 by electrically conductive bonds 30 located in the space of predetermined distance formed between the first face 14 of the stiffener 12 and the circuit board 26 by the shoulders 28 on the solder posts 24.

As shown in FIGS. 2 and 3, in the transceiver apparatus 10, the stiffener 12 includes a second surface 32 adapted to receive a heat sink 34, as illustrated in dashed lines in FIG. 2. The stiffener 12 includes one or more standoffs 36 protruding from the second surface 32 of the stiffener 12 for spacing the second surface 32 of the stiffener 12 a predetermined distance from the heat sink 34.

In the exemplary embodiment of our invention depicted in FIGS. 1–3, the optical transceiver apparatus 10 includes the heat sink 34. Other embodiments of our invention may not require a heat sink. Where a heat sink 34 is utilized, however, it may be advantageous to include a layer of thermally conductive material 38, such as grease or conductive elastomeric foam, sandwiched between the second surface 32 of the stiffener 12 and the heat sink 34. The predetermined space formed by the action of the standoffs 36, as described above and shown in FIG. 3, ensures that the thermally conductive material will be compressed to a predetermined thickness and not squeezed out of the space between the stiffener 12 and the heat sink 34.

In the exemplary embodiment of an optical transceiver apparatus 10, as shown in FIGS. 1–3 the flexible circuit 18 includes a second portion 40 thereof, adapted to receive other electrical components 42, and having a heat sink surface 44 which can be moved into contact with the heat sink 34 by bending the second portion 40 to a position approximately perpendicular to the first portion 16 of the flexible circuit 18. The heat sink 34 is L-shaped, and has a first and a second leg 48, 50. An outer surface 52 of the first leg 48 is adapted for mating with the second surface 32 of the stiffener 12, and an outer surface 54 of the second leg 50 is adapted for receiving the heat sink surface 44 of the second portion 40 flexible circuit 18.

The exemplary embodiment of the transceiver apparatus 10 depicted in FIGS. 1–3 includes the flexible circuit 18. Other embodiments of our invention may or may not include the flexible circuit 18.

Those having skill in the art will recognize that our invention places the components 20 protruding from the flexible circuit 18 in a portion 16 of the flexible circuit 18 conventionally reserved only for electrical connection features, such as the solder balls 21. By so doing, the size of the optical transceiver 10 is reduced, or said another way, additional electrical components can be added to the flexible circuit 18 without increasing the size of the optical transceiver 10. Other features of the stiffener 12, such as the shouldered solder posts 24 and standoffs 36 contribute to minimizing the size and complexity of the optical transceiver 10.

While the embodiments of our invention disclosed herein are presently considered to be preferred, various changes and modifications can be made without departing from the spirit and scope of the invention. The scope of the invention is indicated in the appended claims. All changes or modifications within the meaning and range of equivalents are embraced by the claims.

We claim:

1. An optical transceiver apparatus comprising:
   a flexible circuit having a first portion thereof including an electrical component protruding therefrom; and
   a stiffener having a first surface thereof for attachment of the first portion of a flexible circuit, and a second surface for receiving a heat sink;
   the first surface of the stiffener having a cavity configured for receiving the electrical component, and the second surface of the stiffener having one or more standoffs protruding therefrom for spacing the heat sink a predetermined distance from the second surface of the stiffener.

2. The apparatus of claim 1 wherein the stiffener includes solder posts extending outward from the first surface and adapted for mounting the stiffener on a circuit board.

3. The apparatus of claim 2 wherein the solder posts include a shoulder for spacing the first face of the stiffener a predetermined distance away from the circuit board.

4. The apparatus of claim 3 wherein the electrical component is connected to the flexible circuit by electrically conductive bonds located in the space of predetermined distance formed between the first face of the stiffener and the circuit board by the shoulder on the solder posts.

5. The apparatus of claim 1 further including a heat sink attached to the standoffs protruding from the second surface of the stiffener.

6. The apparatus of claim 5 further including a layer of thermally conductive material sandwiched between the second surface of the stiffener and the heat sink.

7. The apparatus of claim 5 wherein:
the flexible circuit includes a second portion thereof for receiving other electrical components and having a heat sink surface which can be moved into contact with the heat sink; and
the heat sink is L-shaped having a first and a second leg, an outer surface of the first leg adapted for mating with the second surface of the stiffener, and an outer surface of the second leg adapted for receiving the heat sink surface of second portion of the flexible circuit.

8. An optical transceiver apparatus comprising:
a stiffener having a first surface thereof for attachment of a first portion of a flexible circuit having an electrical component protruding therefrom, and a second surface for receiving a heat sink;
the first surface of the stiffener having a cavity therein configured for receiving the electrical component; and
the second surface of the stiffener having one or more standoffs protruding therefrom for spacing the spacing the heat sink a predetermined distance from the second surface of the stiffener.

9. The apparatus of claim 8 further including a heat sink attached to the standoffs protruding from the second surface of the stiffener.

10. The apparatus of claim 9 further including a layer of thermally conductive material sandwiched between the second surface of the stiffener and the heat sink.

11. The apparatus of claim 9 wherein:
the first surface of the stiffener is adapted for receiving a first portion of a flexible circuit including a second portion thereof for receiving other electrical components and having a heat sink surface which can be moved into contact with the heat sink; and
the heat sink is L-shaped having a first and a second leg, defining an outer surface of the first leg adapted for mating with the second surface of the stiffener, and an outer surface of the second leg adapted for receiving the heat sink surface of the second portion of the flexible circuit.

12. The apparatus of claim 11 including a flexible circuit having an electrical component protruding therefrom.

13. The apparatus of claim 8 including a flexible circuit having an electrical component protruding therefrom.

14. The apparatus of claim 8 wherein the cavity in the first surface of the stiffener opens only to the first surface of the stiffener.

15. A stiffener having a first surface thereof for attachment of a first portion of a flexible circuit having an electrical component protruding therefrom, and a second surface for receiving a heat sink;
the first surface of the stiffener having a cavity configured for receiving the electrical component; and
the second surface of the stiffener having one or more standoffs protruding therefrom for spacing the spacing the heat sink a predetermined distance from the second surface of the stiffener.

16. The stiffener of claim 15 further including solder posts extending outward from the first surface for mounting the stiffener on a circuit board.

17. The stiffener of claim 16 wherein the solder posts include a shoulder for spacing the first face of the stiffener a predetermined distance away from the circuit board.

18. The stiffener of claim 15 further including a heat sink attached to the standoffs protruding from second surface of the stiffener.

19. The stiffener of claim 18 further including a layer of thermally conductive material sandwiched between the second surface of the stiffener and the heat sink.

20. The stiffener of claim 18 wherein:
the first surface of the stiffener is adapted for receiving a first portion of a flexible circuit having a second portion thereof for receiving other electrical components and having a heat sink surface thereof which can be moved into contact with the heat sink; and
the heat sink is L-shaped having a first and a second leg, an outer surface of the first leg adapted for mating with the second surface of the stiffener, and an outer surface of the second leg adapted for receiving the heat sink surface of second portion of the flexible circuit.

* * * * *

UNITED STATES PATENT AND TRADEMARK OFFICE
CERTIFICATE OF CORRECTION

PATENT NO. : 6,614,658 B2
DATED : September 2, 2003
INVENTOR(S) : Brezina et al.

It is certified that error appears in the above-identified patent and that said Letters Patent is hereby corrected as shown below:

Title page,
Item [22], should read as follows:
-- Filed: Nov. 5, 2001 --;
Item [56], References Cited, OTHER PUBLICATIONS, eleventh reference, should be replaced with:
-- U.S. Patent Application, Ser. No. 10/006,838 Brezina, et al., filed Nov. 5, 2001 --

Column 1,
Line 29, should read:
-- application Ser. No. 10/007,024 filed on Nov. 5, 2001; --
Line 46, should read:
-- application Ser. No. 10/006,838 filed on Nov. 5, 2001; --

Column 5,
Line 23, should read:
-- standoffs protruding therefrom for spacing --

Signed and Sealed this

Eleventh Day of May, 2004

JON W. DUDAS
*Acting Director of the United States Patent and Trademark Office*